United States Patent
Iwao

(10) Patent No.: US 10,650,905 B2
(45) Date of Patent: May 12, 2020

(54) INSPECTION APPARATUS, IMAGE SENSING APPARATUS, ELECTRONIC EQUIPMENT, AND TRANSPORTATION EQUIPMENT

(71) Applicant: CANON KABUSHIKI KAISHA, Tokyo (JP)

(72) Inventor: Koichi Iwao, Kodaira (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/226,814

(22) Filed: Dec. 20, 2018

(65) Prior Publication Data

US 2019/0198129 A1    Jun. 27, 2019

(30) Foreign Application Priority Data

Dec. 21, 2017   (JP) ................................ 2017-245393

(51) Int. Cl.

| | |
|---|---|
| G11C 29/00 | (2006.01) |
| G11C 29/12 | (2006.01) |
| G11C 29/10 | (2006.01) |
| G01R 31/317 | (2006.01) |
| G06K 9/00 | (2006.01) |
| B60R 11/04 | (2006.01) |
| G06T 1/60 | (2006.01) |

(Continued)

(52) U.S. Cl.
CPC .......... *G11C 29/1201* (2013.01); *B60R 11/04* (2013.01); *G01R 31/3187* (2013.01); *G01R 31/31703* (2013.01); *G01R 31/31724* (2013.01); *G06K 9/00805* (2013.01); *G06T 1/60* (2013.01); *G11C 29/10* (2013.01); *G11C 29/16* (2013.01); *G11C 29/26* (2013.01); *G11C 29/38* (2013.01); *G11C 2029/5602* (2013.01); *G11C 2029/5604* (2013.01)

(58) Field of Classification Search
None
See application file for complete search history.

(56) References Cited

U.S. PATENT DOCUMENTS

| | | | |
|---|---|---|---|
| 7,237,162 B1 * | 6/2007 | Wohl ............ | G01R 31/318547 714/726 |
| 7,577,885 B2 | 8/2009 | Hasegawa et al. | |

(Continued)

FOREIGN PATENT DOCUMENTS

| | | |
|---|---|---|
| JP | 06194421 A | 7/1994 |
| JP | 2000230965 A | 8/2000 |

(Continued)

*Primary Examiner* — Mujtaba M Chaudry
(74) *Attorney, Agent, or Firm* — Venable LLP

(57) ABSTRACT

An inspection apparatus includes a plurality of BIST circuits, each BIST circuit being configured to compare a test pattern output from an inspection target circuit with an expected value and output a signal indicating a comparison result, and a combining unit configured to generate one signal by performing a logical operation on a plurality of the signals indicating the comparison results which are output from the plurality of BIST circuits. The combining unit includes a plurality of level inspection circuits each configured to perform a level inspection of detecting a stuck-at fault. Each of the plurality of BIST circuits is connected to a corresponding one of the plurality of level inspection circuits.

14 Claims, 13 Drawing Sheets

(51) Int. Cl.
*G01R 31/3187* (2006.01)
*G11C 29/26* (2006.01)
*G11C 29/16* (2006.01)
*G11C 29/38* (2006.01)
*G11C 29/56* (2006.01)

(56) References Cited

U.S. PATENT DOCUMENTS

| | | |
|---|---|---|
| 7,797,591 B2 | 9/2010 | Hasegawa et al. |
| 2003/0120985 A1* | 6/2003 | Slobodnik .............. G11C 29/16 714/718 |
| 2005/0060626 A1* | 3/2005 | Rajski ............ G01R 31/318385 714/728 |
| 2006/0053356 A1 | 3/2006 | Terai |
| 2007/0079052 A1 | 4/2007 | Hasegawa et al. |
| 2009/0245000 A1* | 10/2009 | Anzou ................... G11C 29/02 365/201 |
| 2009/0282285 A1 | 11/2009 | Hasegawa et al. |
| 2010/0134133 A1* | 6/2010 | Pagani ............. G01R 31/31713 324/750.3 |
| 2010/0257417 A1* | 10/2010 | Rajski ............ G01R 31/318566 714/731 |
| 2017/0293541 A1* | 10/2017 | Venu ................... G06F 11/2236 |

FOREIGN PATENT DOCUMENTS

| | | |
|---|---|---|
| JP | 2006073917 A | 3/2006 |
| JP | 2007095192 A | 4/2007 |
| JP | 2008021359 A | 1/2008 |

\* cited by examiner

F I G. 10
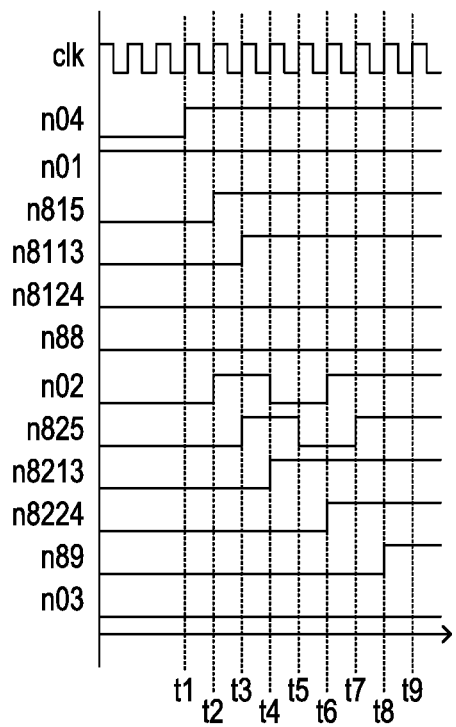
F I G. 11
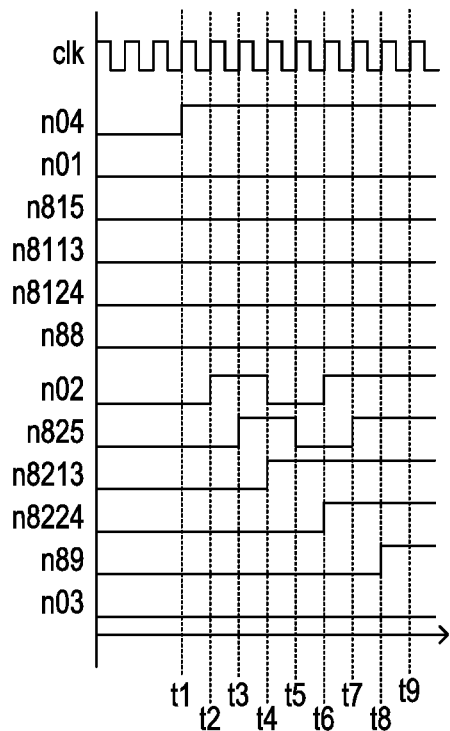

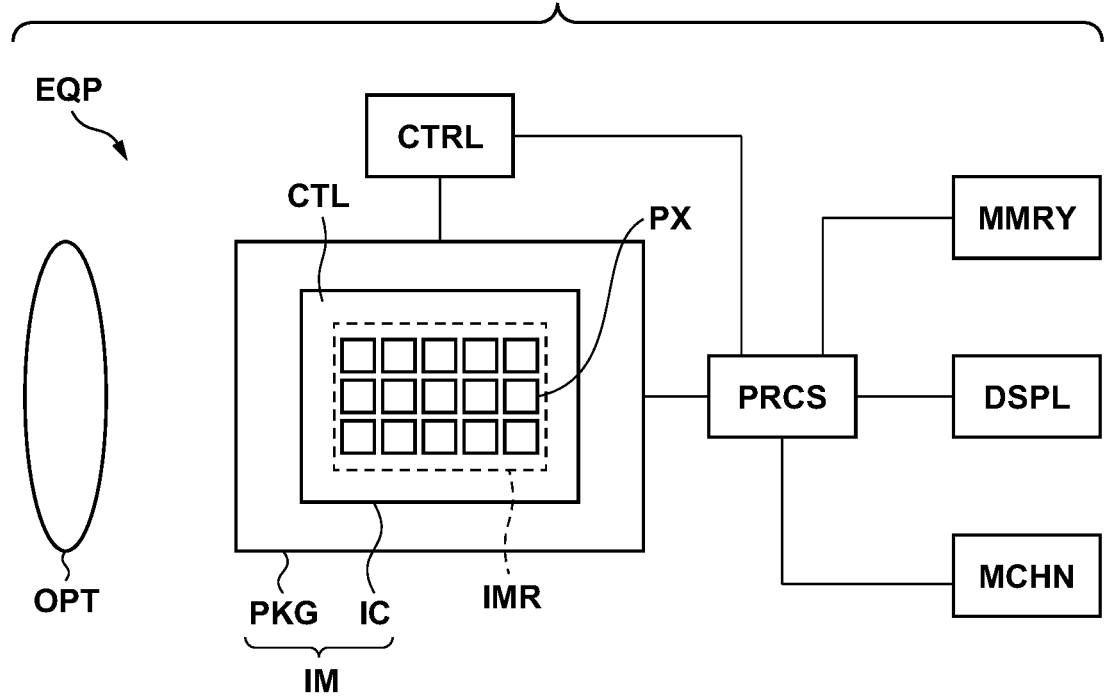
F I G. 14

INSPECTION APPARATUS, IMAGE SENSING APPARATUS, ELECTRONIC EQUIPMENT, AND TRANSPORTATION EQUIPMENT

BACKGROUND OF THE INVENTION

Field of the Invention

The present invention relates to an inspection apparatus, an image sensing apparatus, an electronic equipment, and a transportation equipment.

Description of the Related Art

There is a method that uses a BIST (Built-In Self-Test) circuit for inspecting a memory. A BIST circuit stores a test pattern in a memory and determines whether there is a fault by comparing a value that has been read out from the memory with an expected value. Japanese Patent Laid-Open No. 6-194421 discloses a technique of sequentially inspecting a plurality of memories by using one BIST circuit when these memories are set as inspection targets.

SUMMARY OF THE INVENTION

When one BIST circuit is arranged for a plurality of inspection target circuits, the inspection time is prolonged since the inspection needs to be executed sequentially. An aspect of the present invention shortens the time taken to inspect the plurality of inspection target circuits by using the BIST circuit.

According to an embodiment, an inspection apparatus comprising: a plurality of BIST circuits, each BIST circuit being configured to compare a test pattern output from an inspection target circuit with an expected value and output a signal indicating a comparison result; and a combining unit configured to generate one signal by performing a logical operation on a plurality of the signals indicating the comparison results which are output from the plurality of BIST circuits, wherein the combining unit includes a plurality of level inspection circuits each configured to perform a level inspection of detecting a stuck-at fault, and each of the plurality of BIST circuits is connected to a corresponding one of the plurality of level inspection circuits, is provided.

Further features of the present invention will become apparent from the following description of exemplary embodiments (with reference to the attached drawings).

BRIEF DESCRIPTION OF THE DRAWINGS

FIG. 10 is a timing chart of a case of a stuck-at fault in which a node connected to the BIST circuit is stuck at high level according to the first embodiment;

FIG. 11 is a timing chart of a case of a stuck-at fault in which the node connected to the BIST circuit is stuck at low level according to the first embodiment;

FIG. 14 is a schematic view of an example of an equipment according to another embodiment.

DESCRIPTION OF THE EMBODIMENTS

Figure 1:
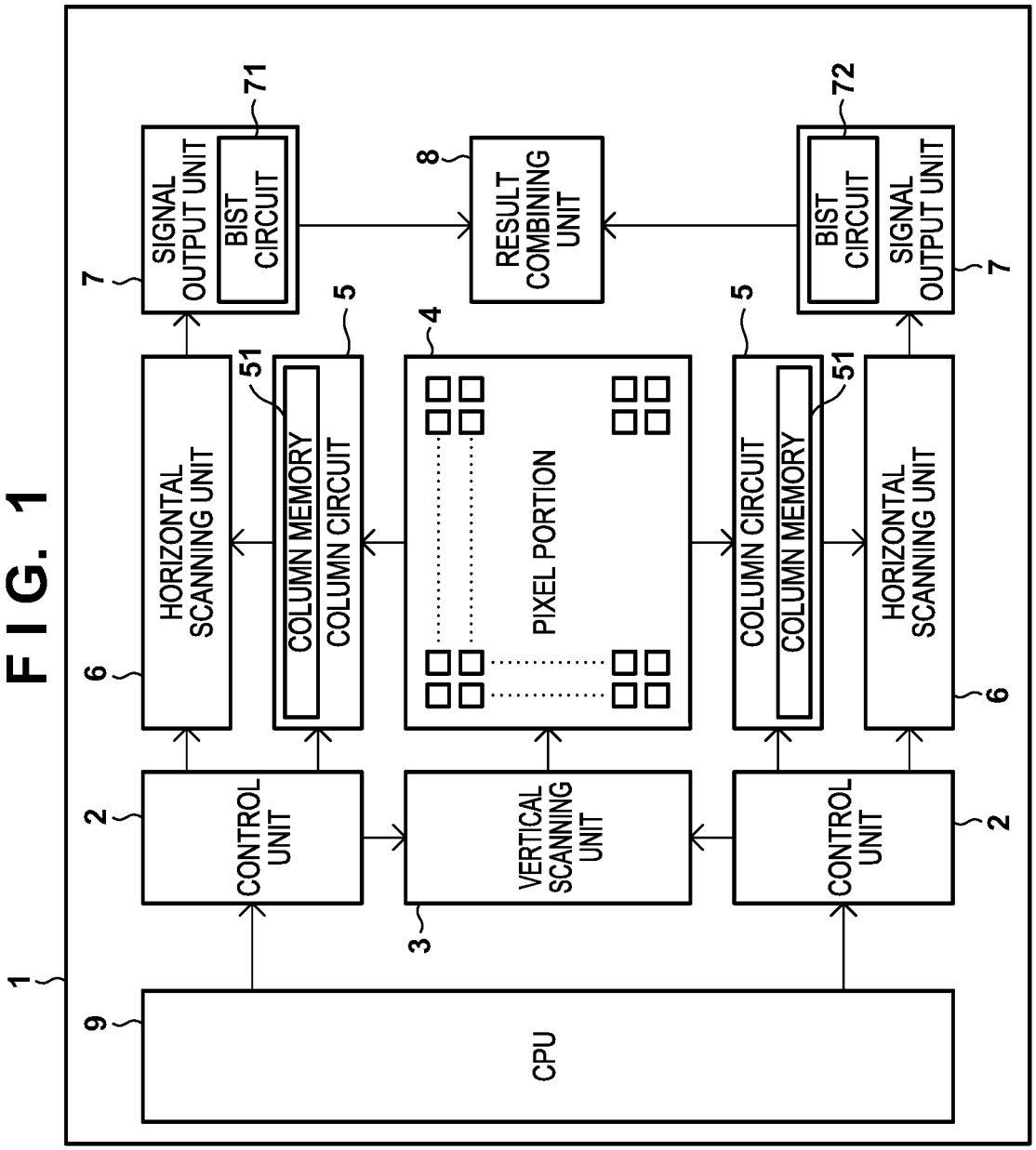
FIG. 1 is a schematic view of an example of an image sensing apparatus according to a first embodiment.

Embodiments of the present invention will be described hereinafter with reference to the accompanying drawings. The same reference numerals are used for the same components throughout the various embodiments, and a repetitive description thereof will be omitted. The embodiments can be changed and combined appropriately. Some embodiments of the present invention are related to an inspection apparatus configured to perform a BIST inspection and a level inspection. A BIST inspection is an inspection for detecting a fault in an inspection target circuit by using a test pattern. A level inspection is an inspection for detecting a stuck-at fault in a node to which a signal indicating the result of the BIST inspection is output. A case in which such an inspection apparatus has been mounted on an image sensing apparatus will be exemplified hereinafter.

First Embodiment

An outline of an image sensing apparatus 1 according to this first embodiment will be described with reference to the block diagram of FIG. 1. The image sensing apparatus 1 includes control units 2, a vertical scanning unit 3, a pixel portion 4, column circuits 5, horizontal scanning units 6, signal output units 7, a result combining unit 8, and a CPU 9. Each control unit 2 operates in accordance with a control signal such as a synchronization signal from the CPU 9 and a setting signal such as an operation mode. The pixel portion 4 includes a pixel array in which a plurality of pixels are arranged so as to form a plurality of rows and a plurality of columns. In this specification, a row direction indicates a horizontal direction (lateral direction) in each drawing, and a column direction indicates a vertical direction (longitudinal direction) in the drawing.

The vertical scanning unit 3 performs readout scanning of the pixel portion 4 and an electron shutter scanning operation in accordance with the control signal from each control unit 2. Each of the column circuits 5 includes an amplification circuit, an analog/digital (AD) conversion circuit, and a column memory 51. The column circuit 5 amplifies a signal from the pixel portion 4 by the amplification circuit, performs AD-conversion on the amplified signal by the AD conversion circuit, and holds the converted signal as a digital signal in the column memory 51. Hence, the column memory 51 stores the signals from the pixel array of pixel portion 4. The image sensing apparatus 1 includes two column circuits 5, and for example, a signal from each pixel in an odd-number column of the pixel portion 4 is supplied to one column circuit 5 and a signal from each pixel in an even-number column of the pixel portion 4 is supplied to the other column circuit 5. Each of the control units 2 supplies a test pattern to the column memory 51 of the corresponding column circuit 5 at the time of a BIST inspection.

Each of the horizontal scanning units 6 receives a control signal from the corresponding control unit 2, and sequentially scans and outputs the signals held in the column memory 51 of the corresponding column circuit 5. The image sensing apparatus 1 includes two horizontal scanning units 6 in correspondence with the two column circuits 5. Each of the signal output units 7 includes a digital processing unit, BIST circuits 71 and 72, a parallel/serial conversion circuit, and an output circuit such as LVDS (low Voltage Differential Signaling) or the like. The signal output unit 7 digitally processes the signal output from the corresponding horizontal scanning unit 6, and outputs the processed signal as serial data to the outside of the image sensing apparatus 1. The image sensing apparatus 1 includes two signal output units 7 in correspondence with the two horizontal scanning units 6. One signal output unit 7 includes the BIST circuit 71, and the other signal output unit 7 includes the BIST circuit 72. In the following description, a description related to the BIST circuit 71 is similarly applicable to the BIST circuit 72 unless otherwise specified. Although the image sensing apparatus 1 includes two BIST circuits 71 and 72 in this embodiment, the number of BIST circuits is not limited to this, and the image sensing apparatus 1 includes a plurality of BIST circuits.

The result combining unit 8 generates one signal by performing a logical operation on a plurality of signals indicating the inspection results by the BIST circuits 71 and 72. The result combining unit 8 may be included in another circuit. An inspection circuit is formed by the plurality of BIST circuits 71 and 72 and the result combining unit 8. The CPU 9 controls the overall image sensing apparatus. The CPU 9 may be arranged in an image sensing system (for example, a camera) on which the image sensing apparatus 1 is mounted, that is, arranged outside the image sensing apparatus 1. Each of column circuits 5 may not have an AD conversion function, and for example, the image sensing apparatus 1 may be formed so that AD conversion is performed outside the image sensing apparatus 1. In this case, the arrangement of the horizontal scanning units 6 and the signal output units 7 is appropriately changed to be compatible with analog signal processing. Each of the control units 2, the vertical scanning unit 3, the horizontal scanning units 6, the signal output units 7, and the result combining unit 8 may be formed by a circuit. Hence, each control unit 2 may be referred to as a control circuit.

Figure 2:
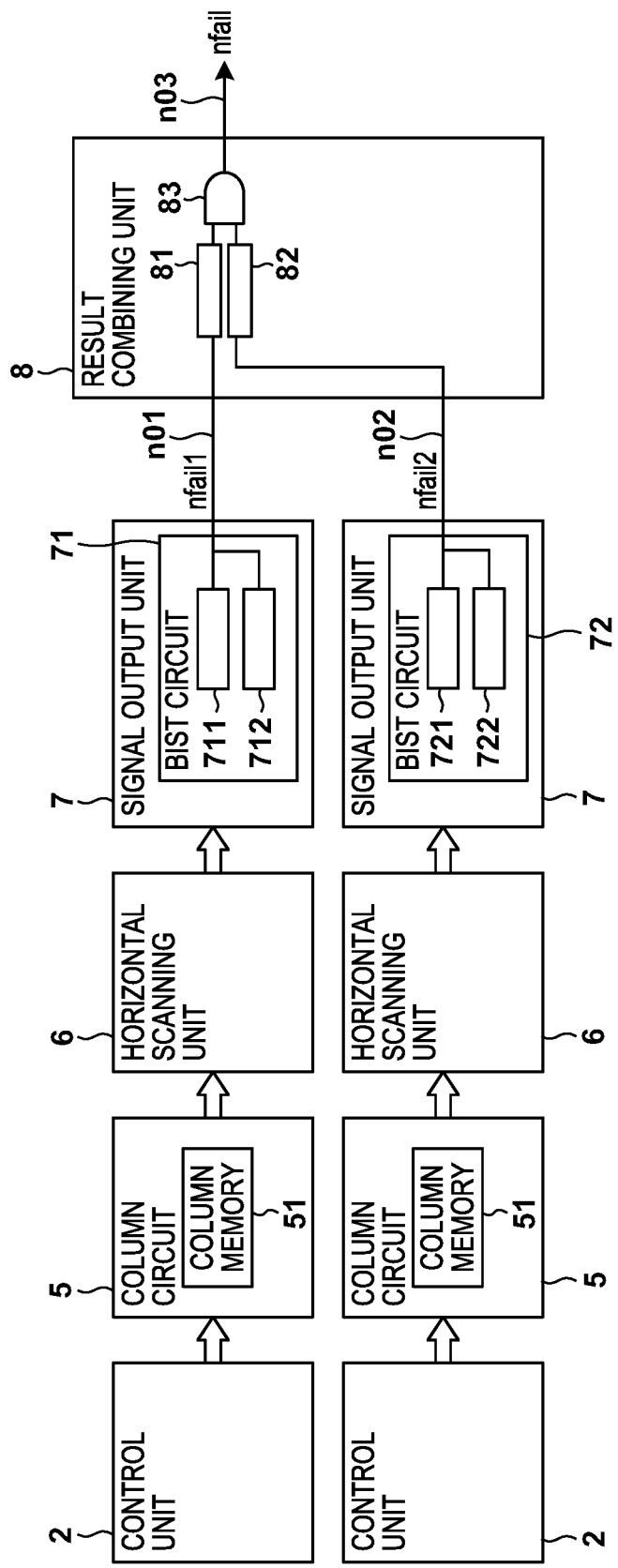
FIG. 2 is a schematic view of an example expressing a path of a BIST circuit from a column memory according to the first embodiment.

The BIST circuits 71 and 72 and the result combining unit 8 will be described in more detail with reference to the block diagram of FIG. 2. The BIST circuit 71 includes a level output unit 711 and a pass/fail determination unit 712. The BIST circuit 72 includes a level output unit 721 and a pass/fail determination unit 722. The result combining unit 8 includes level inspection units 81 and 82 and an AND circuit 83. Each of the level output unit 711 and the pass/fail determination unit 712 supplies an inspection result signal nfail1 to the level inspection unit 81 via a node n01. Each of the level output unit 721 and the pass/fail determination unit 722 supplies an inspection result signal nfail2 to the level inspection unit 82 via a node n02. The inspection result signals nfail1 and nfail2 indicate the BIST inspection results in the BIST inspection and are signals of two types of levels in the level inspection. The level inspection unit 81 supplies a signal corresponding to the level of the input inspection result signal nfail1 to the AND circuit 83. The level inspection unit 82 supplies a signal corresponding to the level of the input inspection result signal nfail2 to the AND circuit 83. The AND circuit 83 outputs a logical product, which is obtained from the output of the level inspection unit 81 and the level inspection unit 82, as an inspection result signal nfail to a node n03.

When the BIST circuit 71 is to perform a BIST inspection, the control unit 2 writes an inspection value of the test pattern in the column memory 51 by controlling the column circuit 5. The control unit 2 reads out the inspection value of the column memory 51 and supplies the value to the pass/fail determination unit 712 of the signal output unit 7 by controlling the horizontal scanning unit 6. The pass/fail determination unit 712 determines whether each test pattern indicates a "pass" or "fail" result based on the inspection value, and supplies the determination result to the level inspection unit 81. In the following example, the pass/fail determination unit 712 sets the level of the inspection result signal nfail1 to high when the determination result is a "pass", and sets the inspection result signal nfail1 to low when the result is a "fail". The level inspection unit 81 outputs a high-level signal when the high inspection result signal has been input and outputs a low-level signal when the low inspection result signal has been input. This is the same when the BIST circuit 72 is to perform the BIST inspection. Hence, the inspection result signal nfail is set to high level if both determination results of the two BIST circuits 71 and 72 indicate a "pass", and the inspection result signal nfail is set to low level if at least one of the determination results is a "fail".

Figure 3:
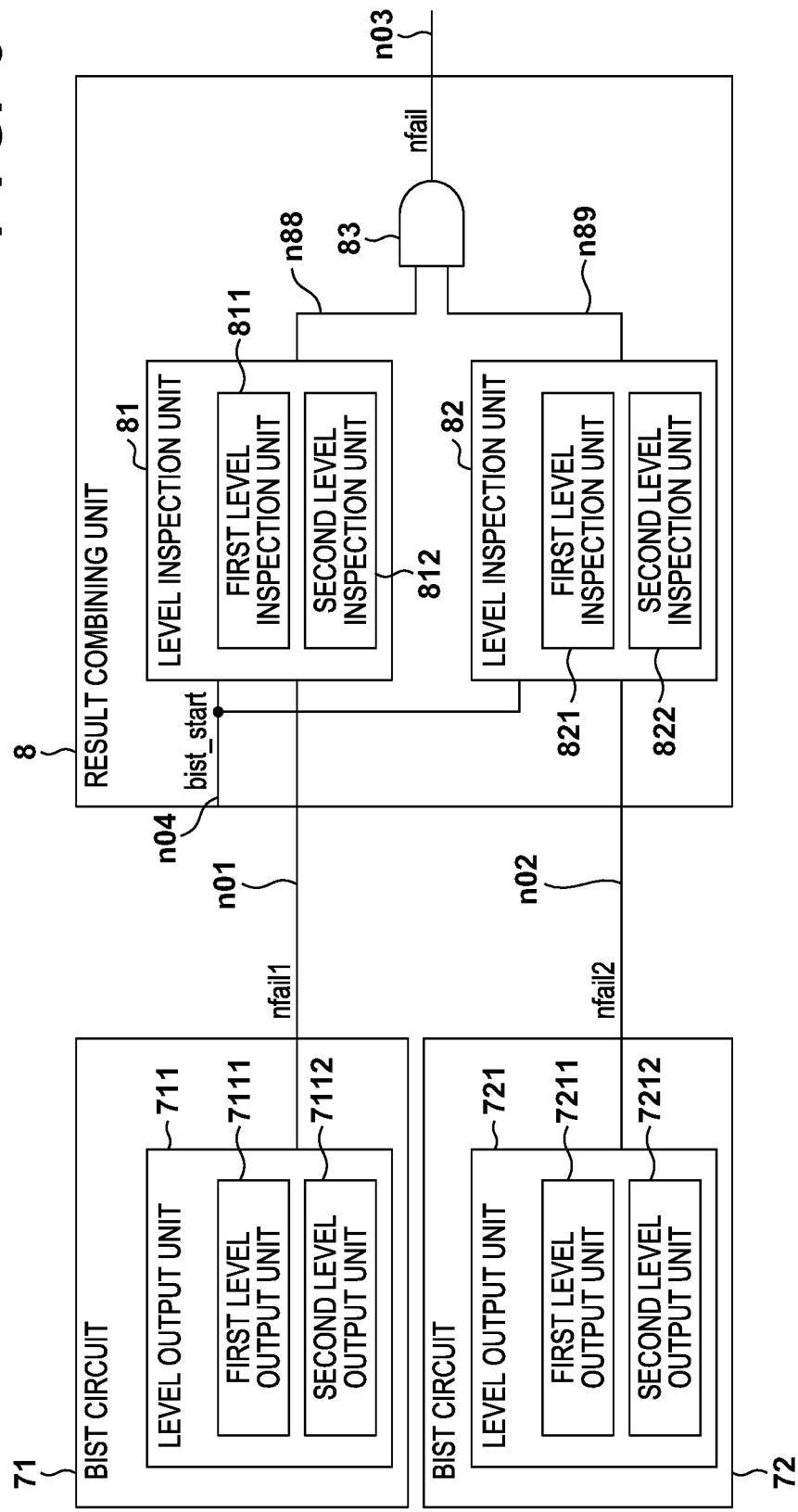
FIG. 3 is a schematic view of an example of a result combining unit from the BIST circuit according to the first embodiment.

The level output units 711 and 721 and the level inspection units 81 and 82 will be described in detail with reference to the block diagram of FIG. 3. The inspection apparatus according to this embodiment executes a level inspection. More specifically, in a level inspection, an inspection for detecting a stuck-at fault in the plurality of nodes n01 and n02 that connect the BIST circuits 71 and 72 to the result combining unit 8 will be performed. A stuck-at fault is a state in which a circuit or an input terminal of an element or an output terminal of the element is fixed to either high level (logical value "1") or low level (logical value "0"). The level output unit 711 includes a first level output unit 7111 and a second level output unit 7112. In the level inspection, the first level output unit 7111 outputs a first level signal to the node n01 which is connected to itself, and the second level output unit 7112 outputs a second level signal to the node n01 which is connected to itself In this manner, the level output unit 711 outputs a plurality of signals of different levels for inspection. In the following example, assume that the level of the first level signal is high and the level of the second level signal is low.

The level inspection unit 81 includes a first level inspection unit 811 and a second level inspection unit 812 to determine whether a signal of two-types of levels has been supplied from the node n01. The first level inspection unit 811 holds a high-level signal when the level of the signal supplied to the level inspection unit 81 is the first level, and holds a low-level signal when otherwise. The second level inspection unit 812 holds a high-level signal when the level of the signal supplied to the level inspection unit 81 is the second level, and holds a low-level signal when otherwise. In the level inspection, when the first level inspection unit 811 and the second level inspection unit 812 are both held at high level, the level inspection unit 81 supplies, to a node n88, a signal (to be referred to as a high-level signal hereinafter) of a level indicating a "pass" as the result of the level inspection. Otherwise, the level inspection unit 81 supplies a signal (to be referred to as a low-level signal hereinafter) of a level indicating a "fail" to the node n88.

The level output unit 721 includes a first level output unit 7211 and a second level output unit 7212 and operates in the same manner as the level output unit 711. The level inspection unit 82 includes a first level inspection unit 821 and a second level inspection unit 822, and operates in the same manner as the level inspection unit 81.

The output from the level inspection unit 81 is supplied to one of the input terminals of the AND circuit 83 via the node n88, and the output from the level inspection unit 82 is supplied to the other input terminal of the AND circuit 83 via a node n89. Hence, when the level inspection result of the node n01 and the level inspection result of the node n02 both indicate a "pass", the result combining unit 8 sets the inspection result signal nfail which is to be output to the node n03 to a signal (to be referred to as a high-level signal hereinafter) of a level indicating a "pass". When at least one of the inspection results is a "fail", the result combining unit 8 sets the inspection result signal nfail which is to be output to the node n03 to a signal (to be referred to as a low-level signal hereinafter) of a level indicating a "fail".

Figure 4:
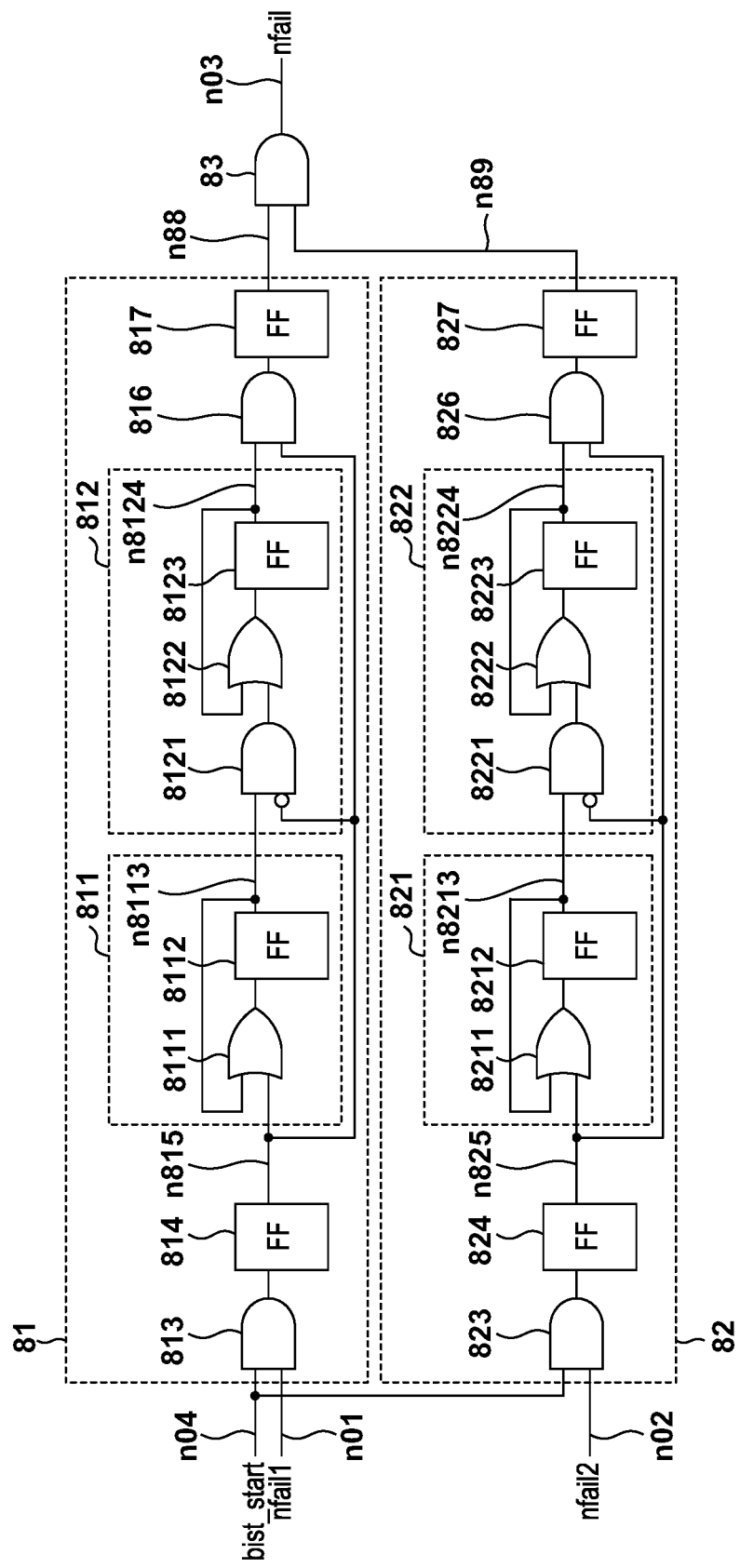
FIG. 4 is a circuit diagram of an example of the result combining unit according to the first embodiment.

A more specific arrangement example of the result combining unit 8 will be described with reference to the block diagram of FIG. 4. The level inspection unit 81 includes, other than the first level inspection unit 811 and the second level inspection unit 812 described above, AND circuits 813 and 816 and FFs 814 and 817. The two input terminals of the AND circuit 813 are connected to the node n01 and a node 04, respectively. As described above, the inspection result signal nfail1 is supplied to the node n01. An inspection start signal bist_start is supplied to the node n04. The inspection start signal bist_start is a signal that indicates the start of the level inspection and the BIST inspection. The level of the inspection start signal bist_start changes from low to high when these inspection operations are to be started, and changes from high to low when these inspection operations are to end. The output terminal of the AND circuit 813 is connected to the input terminal of the FF 814. The output terminal of the FF 814 is connected to a node n815.

The first level inspection unit 811 includes an OR circuit 8111 and an FF 8112. One input terminal of the OR circuit 8111 is connected to the node n815, and the other input terminal is connected to a node n8113. The output terminal of the OR circuit 8111 is connected to the input terminal of the FF 8112. The output terminal of the FF 8112 is connected to the node n8113.

The second level inspection unit 812 includes an AND circuit 8121, an OR circuit 8122, and an FF 8123. One input terminal of the AND circuit 8121 is connected to the node n815 via a NOT circuit, and the other input terminal is connected to the node n8113. One input terminal of the OR circuit 8122 is connected to the output terminal of the AND circuit 8121, and the other input terminal is connected to a node n8124. The output terminal of the OR circuit 8122 is connected to the input terminal of the FF 8123. The output terminal of the FF 8123 is connected to the node n8124.

One input terminal of the AND circuit 816 is connected to the node n815, and the other input terminal is connected to the node n8124. The output terminal of the AND circuit 816 is connected to the input terminal of the FF 817. The output terminal of the FF 817 is connected to the node n88.

The level inspection unit 82 includes, other than the first level inspection unit 821 and the second level inspection unit 822 described above, AND circuits 823 and 826 and FFs 824 and 827. The connection between the elements of the level inspection unit 82 is the same as that of the level inspection unit 81. The first level inspection unit 821 includes an OR circuit 8211 and an FF 8212. The connection between the elements of the first level inspection unit 821 is the same as that of the first level inspection unit 811. The second level inspection unit 822 includes an AND circuit 8221, an OR circuit 8222, and an FF 8223. The connection between the elements of the second level inspection unit 822 is the same as that of the second level inspection unit 812. The result combining unit 8 may detect a stuck-at fault that occurs between the FF 814 and the node n03 and between the FF 824 and the node n03 by a logic test (scan test). A fault in the AND circuits 813 and 823 can be detected by performing the level inspection.

Figure 5:
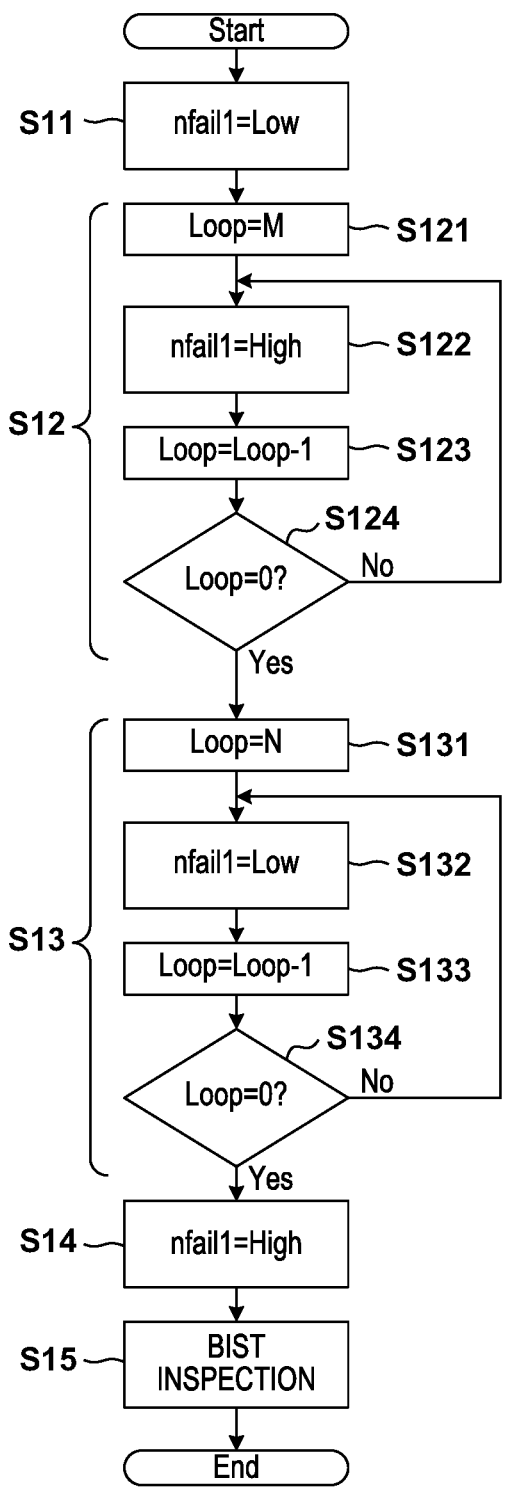
FIG. 5 is a flowchart for explaining an operation example of the BIST circuit according to the first embodiment.

An operation example of the BIST circuit 71 in the execution of the level inspection and the BIST inspection will be described with reference to the flowchart of FIG. 5. The BIST circuit 72 also performs the same operation. The signal nfail1 shown in the flowchart of FIG. 5 is replaced by the signal nfail2 in the operation of the BIST circuit 72. The BIST circuit 71 performs the operation for the level inspection in steps S11 to S14 and performs the operation for the BIST inspection in step S15 after the level inspection has been completed.

In step S11, the level output unit 711 outputs the inspection result signal nfail1 at low level. In step S12, the level output unit 711 outputs the inspection result signal nfail1 at high level during M cycle(s) (M is an integer of 1 or more). More specifically, step S12 is formed by steps S121 to S124. In step S121, M which is the number of cycles set in advance is substituted into a loop variable Loop by the level output unit 711. In step S122, the level output unit 711 outputs the inspection result signal nfail1 at high level. In step S123, the level output unit 711 decrements the value of loop variable Loop by 1. In step S124, the level output unit 711 determines whether the value of the loop variable Loop is 0. If the loop variable Loop is 0 (YES in step S124), the level output unit 711 advances the process to step S131. If the value of the loop variable Loop is not 0 (NO in step S124), the level output unit 711 returns the process to step S122.

In step S13, the level output unit 711 outputs the inspection result signal nfail1 at low level during N cycle(s) (N is an integer of 1 or more). More specifically, step S13 is formed by steps S131 to S134. The processes of steps S131 to S134 are the same as those of steps S121 to S124 except for the point that the number of cycles is N.

In step S14, the level output unit 711 outputs the inspection result signal nfail1 at high level. In step S15, the pass/fail determination unit 712 performs the operation for the BIST inspection of the column memory 51. More specifically, the pass/fail determination unit 712 performs pass/fail determination on each test pattern based on the inspection value written in the column memory 51.

Figure 6:
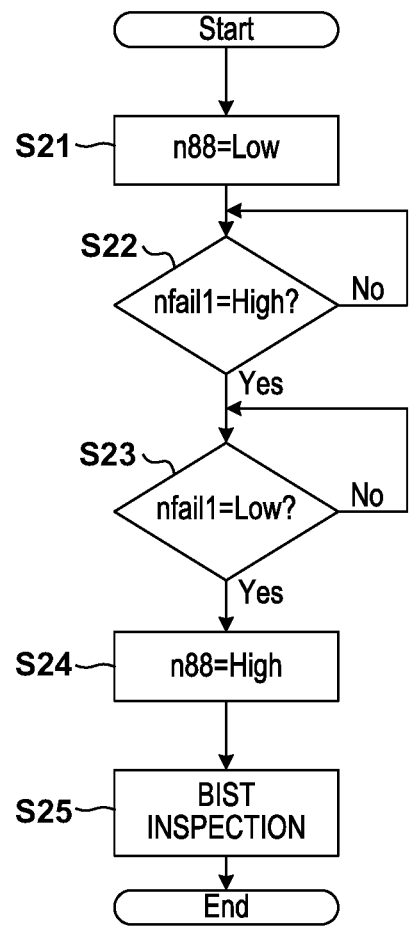
FIG. 6 is a flowchart for explaining an operation example of the result combining unit according to the first embodiment.

An operation example of the level inspection unit 81 at the execution of the level inspection and the BIST inspection will be described with reference to the flowchart of FIG. 6. The level inspection unit 82 also performs the same operation. The signal nfail1 shown in the flowchart of FIG. 6 is replaced by the signal nfail2 in the operation of the level inspection unit 82. The level inspection unit 81 performs the operation for the level inspection in steps S21 to S24 and subsequently performs the operation for the BIST inspection in step S25.

In step S21, the level inspection unit 81 sets the level of the node n88 at low level. In step S22, the level inspection unit 81 determines whether the inspection result signal nfail1 is at high level. If the inspection result signal nfail1 is at high level (YES in step S22), the level inspection unit 81 advances the process to step S23. If the inspection result signal nfail1 is not at high level (NO in step S22), the level inspection unit 81 returns the process to step S22. In step S23, the level inspection unit 81 determines whether the inspection result signal nfail1 is at low level. If the inspection result signal nfail1 is at low level (YES in step S23), the level inspection unit 81 advances the process to step S24. If the inspection result signal nfail1 is not at low level (NO in step S23), the level inspection unit 81 returns the process to step S23.

In step S24, the level inspection unit 81 sets the level of the node n88 to high. In step S25, the level inspection unit 81 performs the operation for the BIST inspection. More specifically, the level inspection unit 81 sets the level of the node n88 to high if the level of the inspection result signal nfail1 is high, and sets the level of the node n88 to low if the level of the inspection result signal nfail1 is low.

As described above, in the level inspection, the BIST circuit 71 switches the level of the inspection result signal nfail1 to low after setting the level of this signal to high. Since "YES" will be determined in steps S22 and S23 of FIG. 6 if a stuck-at fault does not occur, the level inspection unit 81 will start the BIST inspection in step S25. On the other hand, since "YES" will not be determined in step S23 if the inspection result signal nfail1 remains high due to a stuck-at fault, the BIST inspection will not be started. In the same manner, since the "YES" will not be determined in step S22 if the inspection result signal nfail1 remains low due to a stuck-at fault, the BIST inspection will not be started. In either case, the level of the node n88 will remain low if a stuck-at fault has occurred.

Figure 7:
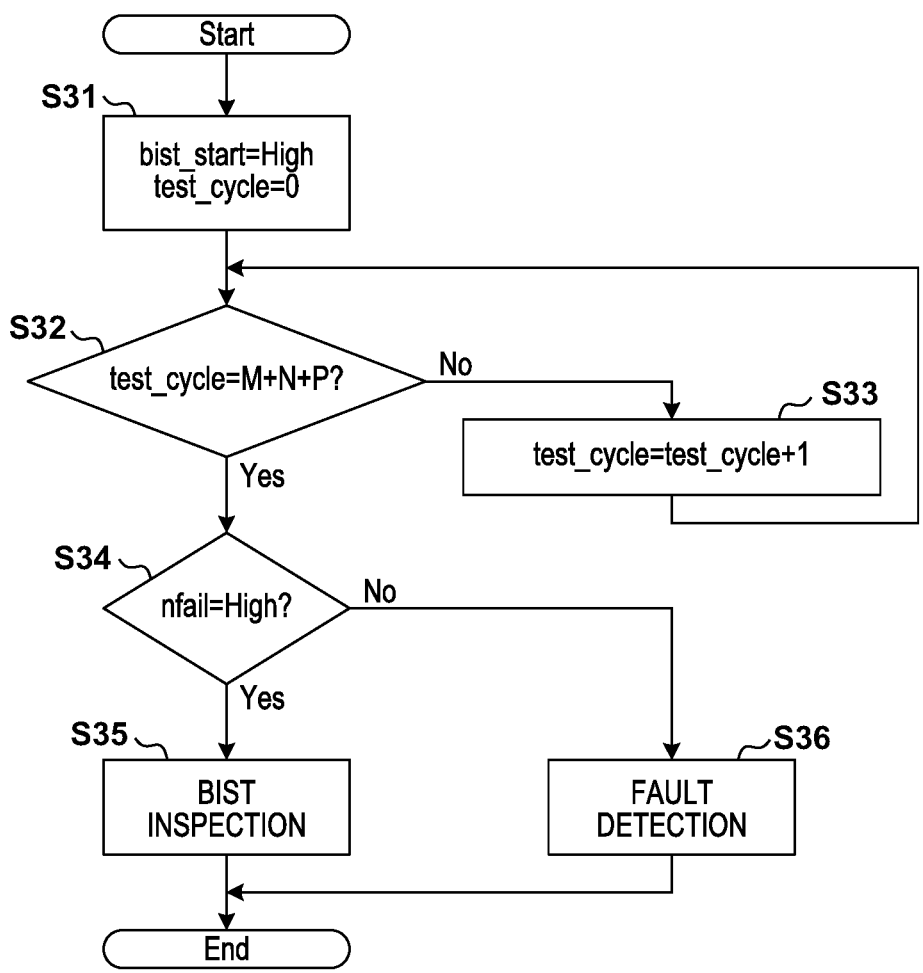
FIG. 7 is a flowchart for explaining an operation example of an overall inspection apparatus according to the first embodiment.

An operation example of the CPU 9 at the execution of the level inspection and the BIST inspection will be described with reference to the flowchart of FIG. 7. This operation may be performed by another circuit instead of the CPU 9. In step S31, the CPU 9 switches the level of the inspection start signal bist_start, which is to be supplied to the node n04, from low to high. Along with this process, 0 is substituted into a test cycle variable test_cycle. In addition, the CPU 9 causes each of the two BIST circuits 71 and 72 to start the operation of FIG. 5, and causes each of the two level inspection units 81 and 82 to start the operation of FIG. 6.

In step S32, the CPU 9 determines whether the value of the test cycle variable test_cycle is M+N+P. M is the value to be substituted into the loop variable Loop in step S121 of FIG. 5, and indicates the number of cycles in which nfail1=high. N is the value to be substituted into the loop variable Loop in step S131 of FIG. 5, and indicates the number of cycles in which nfail1=low. P is the number of cycles other than these cycles, and is, for example, a value that has been determined in advance based on the step count of the FFs included in a signal path, a delay that occurs between the BIST circuits 71 and 72 and the result combining unit 8, and the like. If the value of the test cycle variable test_cycle is M+N+P (YES in step S32), the CPU 9 advances the process to step S34. If the value of the test cycle variable test_cycle is not M+N+P (NO in step S32), the CPU 9 advances the process to step S33.

In step S33, the CPU 9 increments the value of the test cycle variable test_cycle by 1 and returns the process to step S32. In step S34, the CPU 9 determines whether the level of the inspection result signal nfail output to the node n03 is high. Since (M+N+P) cycles have elapsed since the level inspection was started in step S31, the inspection result signal nfail will be high, as described above, if a stuck-at fault has not occurred in both of the nodes n01 and n02. Thus, if the level of the inspection result signal nfail is high (YES in step S34), the CPU 9 advances to the process to step S35. If the level of the inspection result signal nfail is not high (NO in step S34), the CPU 9 advances the process to step S36.

In step S35, the CPU 9 starts an operation related to the BIST inspection. More specifically, the CPU 9 writes a test pattern in each column memory 51 by controlling the corresponding control unit 2. At this stage, each of the two BIST circuits 71 and 72 has started the operation related to the BIST inspection in step S15 of FIG. 5, and each of the two level inspection units 81 and 82 has started the operation related to the BIST inspection in step S25 of FIG. 6. If the level of the inspection result signal nfail has switched from high to low, the CPU 9 detects that a fault has occurred in one of the two column memories 51 and performs corresponding processing. This processing may be a known processing operation.

In step S36, since a stuck-at fault has occurred in at least one of the nodes n01 and n02, the CPU 9 performs processing corresponding to the stuck-at fault without performing the BIST inspection. This processing may be an error notification to a user of the image sensing apparatus 1.

The level of each node corresponding to the inspection results of the level inspection and the BIST inspection will be described with reference to the timing charts of FIGS. 8 to 11. In these timing charts, a reference symbol "clk" indicates a clock signal which is supplied to the respective circuits. Other reference symbols indicate the levels of the respective nodes. Assume that 2 is the value for each of M and N of FIG. 5, and 4 is the value of P of FIG. 7. Values different from these may be used as the values of M, N, and P. For example, M and N may have values different from each other. The values of M and N which are to be used in the BIST circuit 71 may be different from those to be used in the BIST circuit 72. As will be shown in the timing chart hereinafter, the BIST circuit 71 and the BIST circuit 72 execute the level inspection in parallel and subsequently execute the BIST inspection in parallel.

Figure 8:
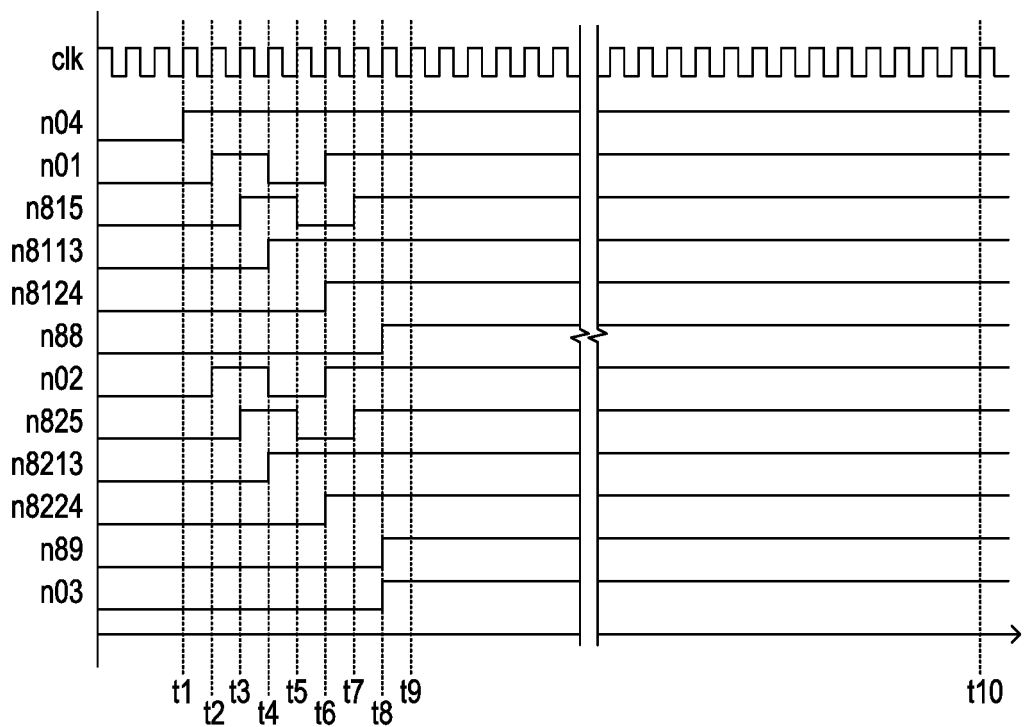
FIG. 8 is a timing chart of a case in which a level inspection and a BIST inspection indicate a "pass" result according to the first embodiment.

The timing chart of FIG. 8 shows a case in which the inspection results of both the level inspection and the BIST inspection are a "pass". At time t1, the CPU 9 starts step S31. This causes the level of the node n04 to switch from low to high, and the level inspection is started. The level of node n04 will be kept at high after this. The BIST circuits 71 and 72 start the process of step S11 in response to the inspection start instruction from the CPU 9. As result, the levels of the respective nodes n01 and n02 are set to low. The level inspection units 81 and 82 start the process of step S21 in response to the inspection start instruction from the CPU 9. As a result, the respective nodes n88 and n89 are set to low level.

At time t2, the CPU 9 starts the process of step S32, the BIST circuits 71 and 72 start the process of step S12, and the level inspection units 81 and 82 start the process of step S22. This causes the levels of the respective nodes n01 and n02 to switch from low to high. The time at which the BIST circuit 71 starts the process of step S12 may be the same as or different from the time at which the BIST circuit 72 starts the process of step S12.

At time t3, since a high-level signal is supplied to both input terminals of the AND circuit 813, the AND circuit 813 supplies a high-level signal to the input terminal of the FF 814. Hence, the internal state of the FF 814 changes to high level, and the level of the node n815 is switched from low to high accordingly. In the same manner, the internal state of the FF 824 changes to high level, and the level of a node n825 is switched from low to high accordingly.

At time t4, the BIST circuits 71 and 72 end the process of step S12 and start the process of step S13. This causes the levels of the nodes n01 and n02 to switch from high to low. Since a high-level signal is supplied to one input terminal of the OR circuit 8111, the OR circuit 8111 supplies a high-level signal to the input terminal of the FF 8112. Hence, the internal state of the FF 8112 changes to high level, and the level of the node n8113 is switched from low to high accordingly. Since the node n8113 is connected to the input terminal of the OR circuit 8111, the FF 8112 will be held at high level even if the level of the node n815 is subsequently changed. A state in which the FF 8112 is held at high level corresponds to the determination of nfail1=high in step S22. Thus, the level inspection unit 81 starts the process of step S23. In the same manner, the internal state of the FF 8212 changes to high level, and a node n8213 is switched from low to high accordingly.

At time t5, since a low-level signal is supplied one input terminal (the terminal connected to the node n01) of the AND circuit 813, the AND circuit 813 supplies a low-level signal to the input terminal of the FF 814. Hence, the internal state of the FF 814 changes to low level, and the level of the node n815 is switched high to low accordingly. In the same manner, the internal state of the FF 824 changes to low level, and the level of the node n825 is switched from high to low accordingly.

At time t6, the BIST circuits 71 and 72 end the process of step S13 and start the process of step S14. This causes the levels of the nodes n01 and n02 to switch from low to high. Since a high-level signal is supplied to both input terminals of the AND circuit 8121, the AND circuit 8121 supplies a high-level signal to one input terminal of the FF 8122. In response to this, the OR circuit 8122 supplies a high-level signal to the input terminal of the FF 8123. Hence, the internal state of the FF 8123 changes to high level, and the level of the node n8124 is switched from low to high accordingly. A state in which the FF 8123 is held at high level corresponds to a state in which nfail1=low has been determined in step S23. In the same manner, the internal state of the FF 8223 is changed to high level, and the level of a node n8224 is switched from low to high.

At time t7, since a high-level signal is supplied to both input terminals of the AND circuit 813, the AND circuit 813 supplies a high-level signal to the input terminal of the FF 814. Hence, the internal state of the FF 814 changes to high level, and the level of the node n815 is switched from low to high accordingly. In the same manner, the internal state of the FF 824 changes to high level, and the level of the node n825 is switched from low to high accordingly.

At time t8, since a high-level signal is supplied to both input terminals of the AND circuit 816, the AND circuit 816 supplies a high-level signal to the input terminal of the FF 817. Hence, the internal state of the FF 817 changes to high level, and the level of the node n88 is switched from low to high accordingly. This operation corresponds to the process of step S24. In the same manner, the internal state of the FF 827 changes to high level, and the level of the node n89 is switched from low to high accordingly. Since a high-level signal is supplied to both input terminals of the AND circuit 83, the AND circuit 83 switches the level of the inspection result signal nfail, which is to be output to the node n03, from low to high.

At time t9, the CPU 9 starts the process of step S34, the BIST circuits 71 and 72 start the process of step S15, and the level inspection units 81 and 82 start the process of step S25. Since the inspection result signal nfail is set to high level, the CPU 9 starts the process of step S35 (BIST inspection). In the subsequent processes, the BIST circuits 71 and 72 will continue to supply high-level signals to the nodes n01 and n02, respectively, if the result of the BIST inspection is a "pass". As a result, the levels of the respective nodes n88 and n89 will be kept at high level, and the level of the inspection result signal nfail will be kept at high level. At time t10, when all of the BIST inspections have been completed while level of the inspection result signal nfail has been kept at high level, the CPU 9 determines that the BIST inspection indicates a "pass" result.

Figure 9:
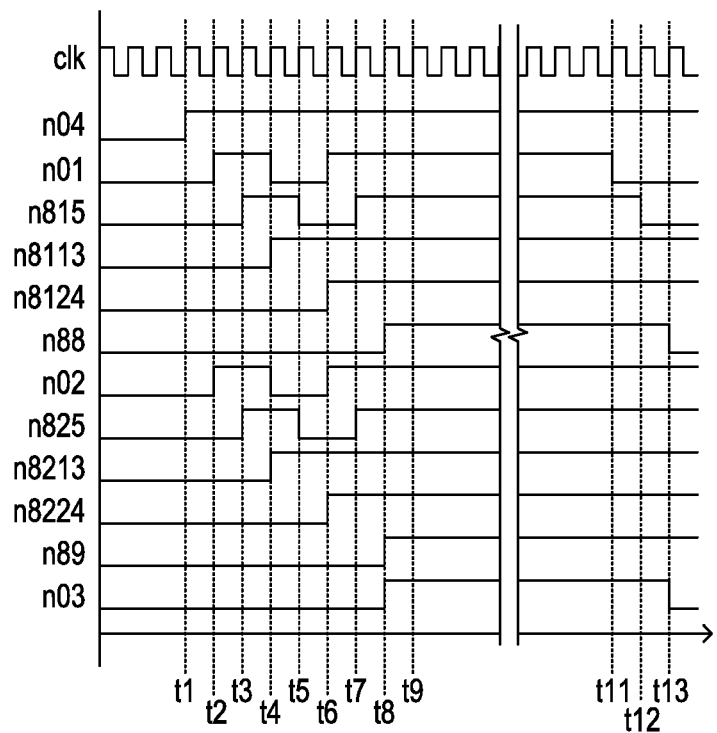
FIG. 9 is a timing chart of a case in which the BIST inspection indicates a "fail" result according to the first embodiment.

The timing chart of FIG. 9 shows a case in which the inspection result of the level inspection is a "pass" but the inspection result of the BIST inspection is a "fail". The processes of times t1 to t9 are the same as those of FIG. 8, and thus a description will be omitted. At time t11, upon determining that result of the BIST inspection is a "fail", the BIST circuit 71 switches the level of the inspection result signal nfail, which is to be supplied to the node n01, from high to low. At time t12, since a low-level signal is supplied to one input terminal (the terminal connected to the node n01) of the AND circuit 813, the AND circuit 813 supplies a low-level signal to the input terminal of the FF 814. Hence, the internal state of the FF 814 changes to low level, and the level of the node n815 is switched from high to low accordingly.

At time t13, since a low-level signal is supplied to one input terminal (the terminal connected to the node n815) of the AND circuit 816, the AND circuit 816 supplies a low-level signal to the input terminal of the FF 817. Hence, the internal state of the FF 817 is changed to low level, and the level of the node n88 is switched from high to low accordingly. Since a low-level signal is supplied to one input terminal (the terminal connected to the node n88) of the AND circuit 83, the AND circuit 83 switches the level of the inspection result signal nfail, which is to be output to the node n03, from high to low. Upon detecting that the inspection result signal nfail has changed to low level, the CPU 9 stops the BIST inspection and determines that the BIST inspection indicates a "fail" result.

The timing chart of FIG. 10 shows a case in which the inspection result of the level inspection is a "fail" because a stuck-at fault in which the node n01 is maintained at high level has occurred. As shown in FIG. 10, the level of the node n01 is constantly high. The operations of the BIST circuits 71 and 72 and the level inspection unit 82 are the same as those described in FIG. 8, and thus a description will be omitted.

The operation performed at time t1 is the same as that performed in FIG. 8. However, since a stuck-at fault has occurred in the node n01, the level of the node n01 is kept high even when the BIST circuit 71 changes the inspection result signal nfail1 to low level. The operations performed at times t2 and t3 are the same as those performed in FIG. 8.

At time t4, the BIST circuit 71 ends the process of step S12 and starts the process of step S13. However, since the stuck-at fault has occurred in the node n01, the level of the node n01 is kept high. In the same manner as in the case of FIG. 8, the internal state of the FF 8112 changes to high level, and the level of the node n8113 is switched from low to high accordingly.

At time t5, since a high-level signal is supplied to both input terminals of the AND circuit 813, the AND circuit 813 supplies a high-level signal to the input terminal of the FF 814. Hence, the internal state of the FF 814 is kept at high level, and the level of the node n815 is kept high accordingly.

At time t6, since a low-level signal is supplied one input terminal (the terminal connected to the NOT circuit) of the AND circuit 8121, the AND circuit 8121 supplies a low-level signal to the one of the input terminals of the OR circuit 8122. In response to this, the OR circuit 8122 supplies a low-level signal to the input terminal of the FF 8123. Hence, the internal state of the FF 8123 is kept at low level, and the level of the node n8124 is kept low accordingly. A state in which the FF 8123 is held at low level corresponds to a state in which nfail1≠low has been determined in step S23. This causes the level inspection unit 81 to repeat the process of step S23, and the process cannot advance to step S24.

At time t7, since a high-level signal is supplied to both input terminals of the AND circuit 813, the AND circuit 813 supplies a high-level signal to the input terminal of the FF 814. Hence, the internal state of the FF 814 is kept at high level, and the level of the node n815 is kept high accordingly.

At time t8, since a low-level signal is supplied to one input terminal (the terminal connected to the node n8124) of the AND circuit 816, the AND circuit 816 supplies a low-level signal to the input terminal of the FF 817. Hence, the internal state of the FF 817 is kept at low level, and the level of the node n88 is kept low accordingly. Since a low-level signal is supplied to one input terminal (the terminal connected to the node n88) of the AND circuit 83, the AND circuit 83 maintains the inspection result signal nfail, which is to be output to the node n03, at low level.

At time t9, the CPU 9 starts the process of step S34, the BIST circuits 71 and 72 start the process of step S15, and the level inspection unit 82 starts the process of step S25. The level inspection unit 81 continues to execute the process of step S23. Since the inspection result signal nfail is set to low level, the CPU 9 starts the process of step S36 (fault detection). The CPU 9 will not perform the BIST inspection in this case.

The timing chart of FIG. 11 shows a case in which the inspection result of the level inspection is a "fail" because a stuck-at fault in which the node n01 is maintained at low level has occurred. As shown in FIG. 11, the level of the node n01 is constantly low. The operations of the BIST circuits 71 and 72 and the level inspection unit 82 are the same as those described in FIG. 8, and thus a description will be omitted.

The operations performed at times t1 and t2 are the same as those performed in FIG. 8. However, since a stuck-at fault has occurred in the node n01, the level of the node n01 is kept low even when the BIST circuit 71 changes the inspection result signal nfail1 to high level.

At time t3, since a low-level signal is supplied to one input terminal (the terminal connected to the node n01) of the AND circuit 813, the AND circuit 813 supplies a low-level signal to the input terminal of the FF 814. Hence, the internal state of the FF 814 is kept at low level, and the level of the node n815 is kept low accordingly.

At time t4, since a low-level signal is supplied to both input terminals of the OR circuit 8111, the OR circuit 8111 supplies a low-level signal to the input terminal of the FF 8112. Hence, the internal state of the FF 8112 is kept at low level, and the level of the node n8113 is kept low accordingly. A state in which the FF 8112 is held at low level corresponds to a state in which nfail1≠high has been determined in step S22. This causes the level inspection unit 81 to repeat the process of step S22, and the process cannot advance to step S23.

At time t5, since a low-level signal is supplied to one input terminal (the terminal connected to the node n01) of the AND circuit 813, the AND circuit 813 supplies a low-level signal to the input terminal of the FF 814. Hence, the internal state of the FF 814 is kept at low level, and the level of the node n815 is kept low accordingly.

At time t6, since a low-level signal is supplied to one input terminal (the terminal connected to the node n8113) of the AND circuit 8121, the AND circuit 8121 supplies a low-level signal to one input terminal of the OR circuit 8122. Accordingly, the OR circuit 8122 supplies a low-level signal to the input terminal of the FF 8123. Hence, the internal state of the FF 8123 is kept at low level, and the level of the node n8124 is kept low accordingly.

At time t7, since a low-level signal is supplied to one input terminal (the terminal connected to the node n01) of the AND circuit 813, the AND circuit 813 supplies a low-level signal to the input terminal of the FF 814. Hence, the internal state of the FF 814 is kept at low level, and the level of the node n815 is kept low accordingly.

At time t8, since a low-level signal is supplied to both input terminals of the AND circuit 816, the AND circuit 816 supplies a low-level signal to the input terminal of the FF 817. Hence, the internal state of the FF 817 is kept at low level, and the level of the node n88 is kept low accordingly. Since a low-level signal is supplied to one input terminal (the terminal connected to the node n88) of the AND circuit 83, the AND circuit 83 maintains the inspection result signal nfail, which is to be output to the node n03, at low level.

At time t9, the CPU 9 starts the process of step S34, the BIST circuits 71 and 72 start the process of step S15, and the level inspection unit 82 starts the process of step S25. The level inspection unit 81 continues to execute the process of step S22. Since the inspection result signal nfail is set to low level, the CPU 9 starts the process of step S36 (fault detection). The CPU 9 will not perform the BIST inspection in this case.

Figure 12:
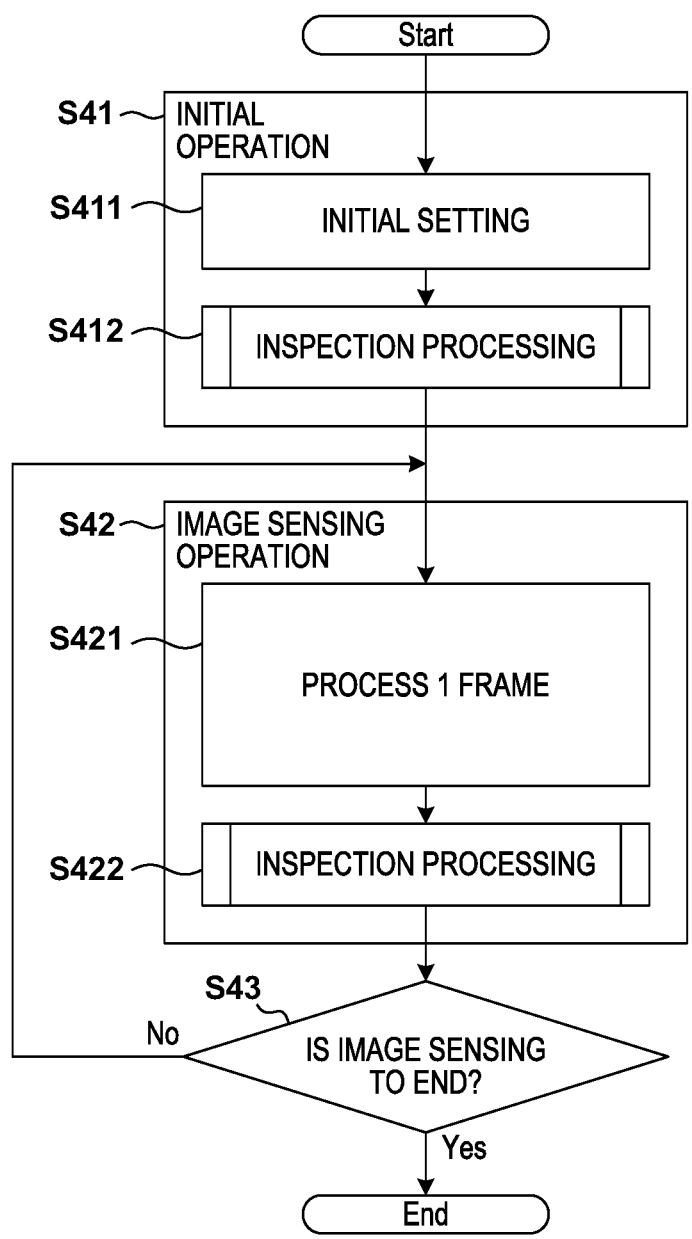
FIG. 12 is a flowchart for explaining an operation example of the image sensing apparatus according to the first embodiment.

An operation example of the image sensing apparatus 1 will be described with reference to the flowchart of FIG. 12. The image sensing apparatus 1 is mounted, for example, on a vehicle. In step S41, the CPU 9 performs an initial operation. More specifically, in step S411, the CPU 9 executes initial settings of the image sensing apparatus 1. Next, in step S412, the CPU 9 executes the operation of FIG. 7.

In step S42, the CPU 9 executes an image sensing operation. More specifically, in step S421, the CPU 9 generates a frame. Next, in step S422, the CPU 9 executes the operation of FIG. 7. In step S43, the CPU 9 determines whether to end the image sensing operation. If the image sensing operation is to end (YES in step S43), the CPU 9 ends the processing. Otherwise (NO in step S43), the CPU 9 returns the process to step S42.

According to the above-described processing, the CPU 9 executes inspections using the BIST circuits 71 and 72, that is, the level inspection and the BIST inspection, before the image sensing operation and in a period (a so-called vertical blanking period) between frames during the image sensing operation. If the results of both the level inspection and the BIST inspection are a "pass", the CPU 9 will continue the operation of FIG. 12. Otherwise, the processing ends. In this embodiment, since the level inspection and the BIST inspection of the plurality of column memories 51 are performed in parallel, the inspection time can be shortened.

In the embodiment described above, it is arranged so that the inspection circuit executes both the BIST inspection and the level inspection. Instead of this arrangement, it may be set so that the inspection circuit will execute only one of the BIST inspection and the level inspection. In either case, since the inspections by the BIST circuits 71 and 72 can be performed in parallel by using the result combining unit 8 to combine the inspection results obtained by the BIST circuits 71 and 72, it is possible to shorten the inspection time of the plurality of inspection target circuits using the BIST circuit. Although the inspection target circuit of the BIST circuit was a memory in the above-described embodiment, the BIST circuit may inspect a logic circuit or another circuit instead.

In the above-described embodiment, the BIST circuits 71 and 72 may have the same circuit arrangement as each other or different circuit arrangements. The BIST circuits 71 and 72 will execute the operation of the above-described FIG. 5 even in a case in which they have circuit arrangements different from each other.

Second Embodiment

Figure 13:
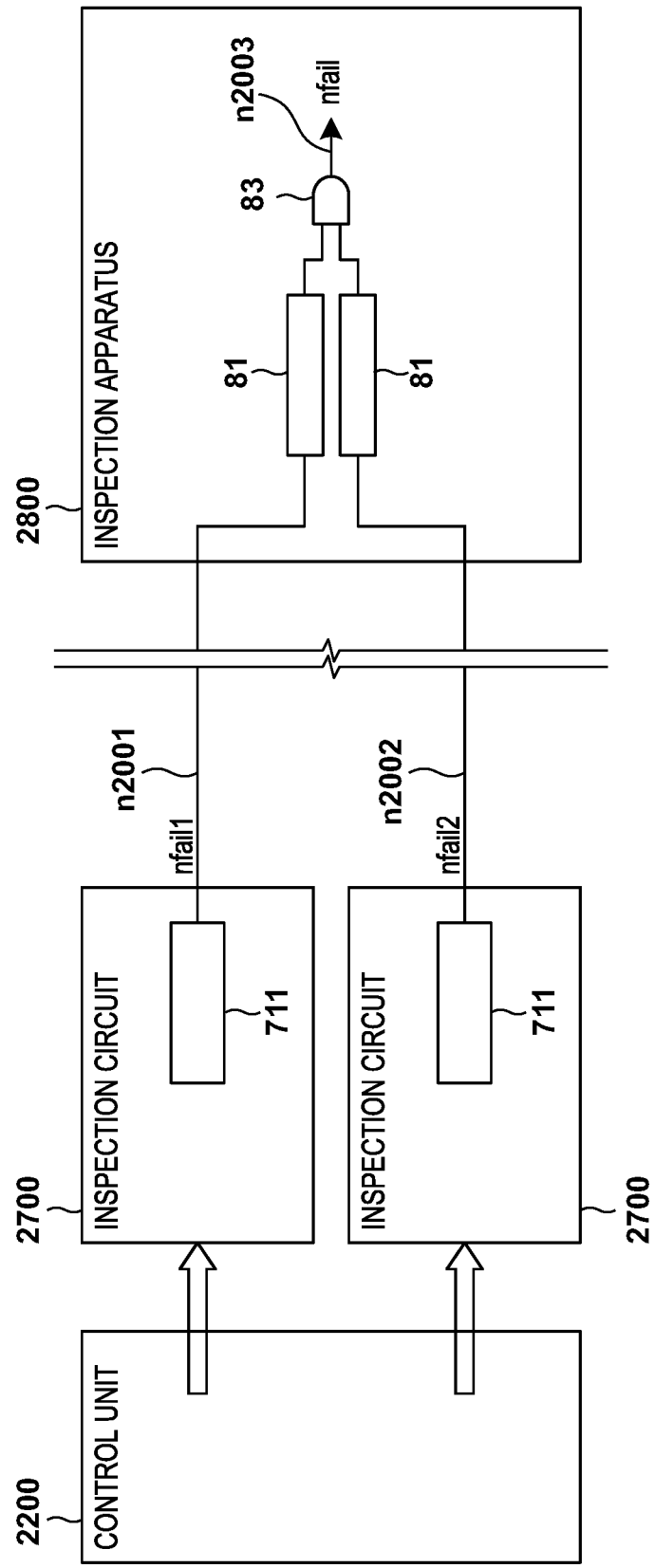
FIG. 13 is a schematic view showing an example of a single combining unit from an inspection circuit according to a second embodiment.

An inspection apparatus according to the second embodiment will be described with reference to the block diagram of FIG. 13. A control unit 2200 controls a plurality of identical inspection circuits 2700. Each inspection circuit 2700 includes a level output unit 711. An inspection apparatus 2800 includes two identical level inspection units 81 and an AND circuit 83. One inspection circuit 2700 is connected to one level inspection unit 81 via a node n2001, and the other inspection circuit 2700 is connected to the other level inspection unit 81 via a node n2002. The inspection apparatus 2800 supplies an inspection result signal nfail from the AND circuit 83 to an ATE (Automated Test Equipment) via a node n2003.

Other Embodiments

As application examples of the image sensing apparatus 1 according to the above-described embodiments, an electronic equipment such as a camera or a smartphone incorporating the image sensing apparatus 1 and a transportation equipment such as an automobile will be exemplified hereinafter. Here, the concept of a camera includes not only an apparatus whose main purpose is image sensing but also an apparatus (for example, a personal computer, a mobile terminal such as a tablet, etc.) that auxiliarly has an image sensing function.

FIG. 14 is a schematic view of an equipment EQP incorporating an image sensing apparatus IM. An electronic equipment (an information equipment) such as a camera or a smartphone, a transportation equipment such as an automobile or an airplane, or the like is an example of the equipment EQP. The image sensing apparatus IM can include, other than a semiconductor device IC that includes a semiconductor chip on which an image sensing region IMR on which pixels PX have been arranged in an array has been arranged, a package PKG that contains the semiconductor device IC. The package PKG can include a base on which the semiconductor device IC is fixed and a lid member made of glass or the like which faces the semiconductor device IC, and connection members such as a bump and a bonding wire that connect a terminal arranged in the base to a terminal arranged in the semiconductor device IC. The equipment EQP can further include at least one of an optical system OPT, a control apparatus CTRL, a processing apparatus PRCS, a display apparatus DSPL, and a memory apparatus MMRY. The optical system OPT forms an optical image on the image sensing apparatus IM and is formed from, for example, a lens, a shutter, and a mirror. The control apparatus CTRL controls the operation of the image sensing apparatus IM and is a semiconductor device such as an ASIC. The processing apparatus PRCS processes signals output from the image sensing apparatus IM and is a semiconductor device such as a CPU or an ASIC for forming an AFE (Analog Front End) or a DFE (Digital Front End). The display apparatus DSPL is an EL display apparatus or a liquid crystal display apparatus that displays information (image) acquired by the image sensing apparatus IM. The memory apparatus MMRY is a magnetic device or a semiconductor device for storing information (image) acquired by the image sensing apparatus IM. The memory apparatus MMRY is a volatile memory such as an SRAM, DRAM, or the like or a nonvolatile memory such as a flash memory, a hard disk drive, or the like. A mechanical apparatus MCHN includes a driving unit or propulsion unit such as a motor, an engine, or the like. The mechanical apparatus MCHN in the camera can drive the components of the optical system OPT for zooming, focusing, and shutter operations. In the equipment EQP, signals output from the image sensing apparatus IM are displayed on the display apparatus DSPL and are transmitted externally by a communication apparatus (not shown) included in the equipment EQP. Hence, the equipment EQP may further include the memory apparatus MMRY and the processing apparatus PRCS that are separate from a storage circuit unit and a calculation circuit unit included in a control/signal processing circuit provided in the image sensing apparatus IM.

Figure 15A:
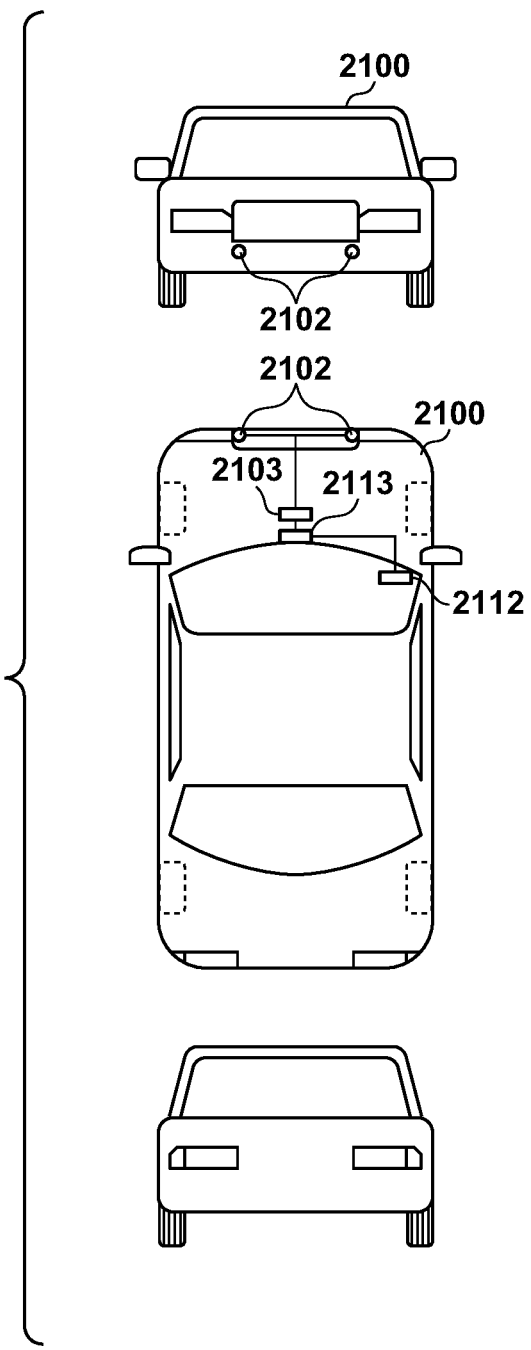
FIGS. 15A and 15B are schematic views of an example of a transportation equipment according to the other embodiment.

A camera incorporating the image sensing apparatus IM is applicable as a monitoring camera, an onboard camera mounted in a transportation equipment such as an automobile or a railroad car, or the like. A case in which the camera incorporating the image sensing apparatus IM is applied to a transportation equipment will be exemplified here. A transportation equipment 2100 is, for example, an automobile including an onboard camera 2101 shown in FIGS. 15A and 15B. FIG. 15A schematically shows the outer appearance and the main internal structure of the transportation equipment 2100. The transportation equipment 2100 includes an image sensing apparatus 2102, an image sensing system ASIC (Application Specific Integrated Circuit) 2103, a warning apparatus 2112, and a control apparatus 2113.

The above-described image sensing apparatus IM is used in the image sensing apparatus 2102. The warning apparatus 2112 warns a driver when it receives an abnormality signal from an image-sensing system, a vehicle sensor, a control unit, or the like. The control apparatus 2113 comprehensively controls the operations of the image sensing system, the vehicle sensor, the control unit, and the like. Note that the transportation equipment 2100 need not include the control apparatus 2113. In this case, the image sensing system, the vehicle sensor, and the control unit each can individually include a communication interface and exchange control signals via a communication network (for example, CAN standards).

Figure 15B:
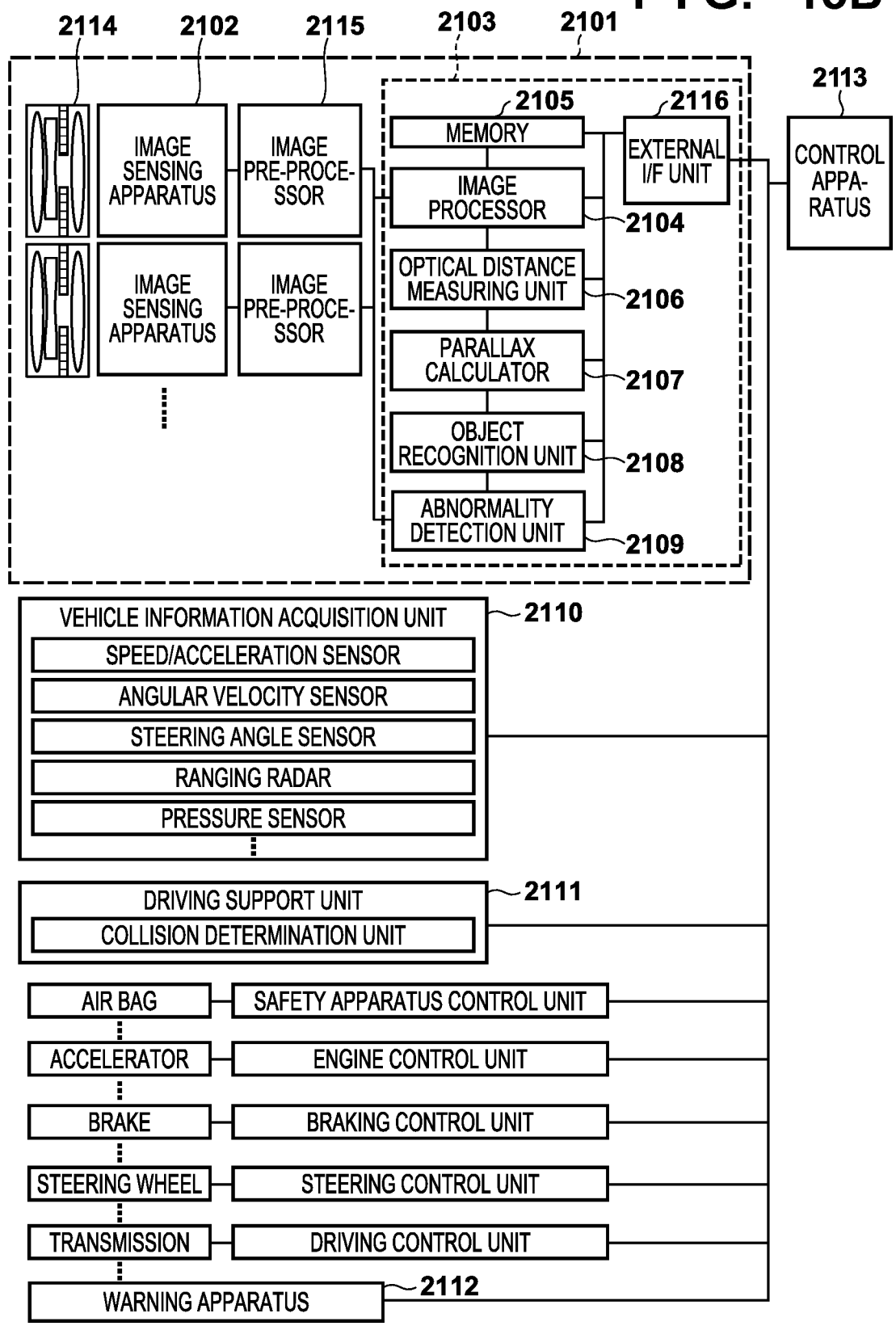

FIG. 15B is a block diagram showing the system arrangement of the transportation equipment 2100. The transportation equipment 2100 includes the image sensing apparatus 2102 and the image sensing apparatus 2102. That is, the onboard camera according to this embodiment is a stereo camera. An object image is formed by an optical section 2114 on each image sensing apparatus 2102. An image signal output from each image sensing apparatus 2102 is processed by an image pre-processor 2115 and transmitted to the image sensing system ASIC 2103. The image pre-processor 2115 performs processing such as S-N calculation and synchronization signal addition.

The image sensing system ASIC 2103 includes an image processor 2104, a memory 2105, an optical distance measuring unit 2106, a parallax calculator 2107, an object recognition unit 2108, an abnormality detection unit 2109, and an external interface (I/F) unit 2116. The image processor 2104 generates an image signal by processing signals output from the pixels of each image sensing apparatus 2102. The image processor 2104 also performs correction of image signals and interpolation of abnormal pixels. The memory 2105 temporarily holds the image signal. The memory 2105 may also store the position of a known abnormal pixel in the image sensing apparatus 2102. The optical distance measuring unit 2106 uses the image signal to perform focusing or distance measurement of an object. The parallax calculator 2107 performs object collation (stereo matching) of a parallax image. The object recognition unit 2108 analyzes image signals to recognize objects such as a transportation equipment, a person, a road sign, a road, and the like. The abnormality detection unit 2109 detects a fault or an error operation of the image sensing apparatus 2102. When a fault or an error operation has been detected, the abnormality detection unit 2109 transmits a signal indicating the detection of an abnormality to the control apparatus 2113. The external I/F unit 2116 mediates the exchange of information between the units of the image sensing system ASIC 2103 and the control apparatus 2113 or the various kinds of control units.

The transportation equipment 2100 includes a vehicle information acquisition unit 2110 and a driving support unit 2111. The vehicle information acquisition unit 2110 includes vehicle sensors such as a speed/acceleration sensor, an angular velocity sensor, a steering angle sensor, a ranging radar, and a pressure sensor.

The driving support unit 2111 includes a collision determination unit. The collision determination unit determines whether there is a possibility of collision with an object based on the pieces of information from the optical distance measuring unit 2106, the parallax calculator 2107, and the object recognition unit 2108. The optical distance measuring unit 2106 and the parallax calculator 2107 are examples of distance information acquisition units that acquire distance information of a target object. That is, distance information includes pieces of information related to the parallax, the defocus amount, the distance to the target object, and the like. The collision determination unit may use one of these pieces of distance information to determine the possibility of a collision. Each distance information acquisition unit may be implemented by dedicated hardware or a software module.

An example in which the driving support unit 2111 controls the transportation equipment 2100 so as to avoid a collision with another object has been described. However, the present invention is also applicable to a case in which automated driving control for following another vehicle or automated driving control for preventing the vehicle from drifting out of the lane is performed.

The transportation equipment 2100 also includes driving apparatuses, which are used for movement or for supporting the movement, such as an air bag, an accelerator, a brake, a steering wheel, a transmission, an engine, a motor, wheels, propellers, and the like. The transportation equipment 2100 also includes control units for these apparatuses. Each control unit controls a corresponding driving apparatus based on a control signal of the control apparatus 2113.

The image sensing system used in each embodiment is applicable not only to an automobile and a railroad car but also to, for example, a transportation equipment such as a ship, an airplane, or an industrial robot. In addition, the image sensing system is applicable not only to a transportation equipment but also to an equipment that uses object recognition widely such as an ITS (Intelligent Transportation System).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-245393, filed Dec. 21, 2017, which is hereby incorporated by reference herein in its entirety.

What is claimed is:

1. An inspection apparatus comprising:
   a plurality of BIST circuits, each BIST circuit being configured to compare a test pattern output from an inspection target circuit with an expected value and output a signal indicating a comparison result; and
   a combining unit configured to generate one signal by performing a logical operation on a plurality of the signals indicating the comparison results which are output from the plurality of BIST circuits,
   wherein the combining unit includes a plurality of level inspection circuits each configured to perform a level inspection of detecting a stuck-at fault, and
   each of the plurality of BIST circuits is connected to a corresponding one of the plurality of level inspection circuits.

2. The apparatus according to claim 1, wherein
   in the level inspection,
   each of the plurality of BIST circuits sequentially outputs signals of two types of levels to a level inspection circuit to which each BIST circuit is connected among the plurality of level inspection circuits, and
   each of the plurality of level inspection circuits determines whether the signal of two types of levels has been supplied from a BIST circuit to which each BIST circuit is connected among the plurality of BIST circuits.

3. The apparatus according to claim 2, wherein the plurality of BIST circuits and the combining unit start comparing the test pattern and the expected value after the level inspection is completed.

4. The apparatus according to claim 2, wherein the plurality of BIST circuits and the combining unit execute the level inspections in parallel.

5. The apparatus according to claim 1, wherein the plurality of BIST circuits have the same circuit arrangement.

6. The apparatus according to claim 1, wherein the inspection apparatus is mounted on an image sensing apparatus that comprises a plurality of memories configured to store a signal from a pixel array, and
   the plurality of BIST circuits inspect the plurality of memories.

7. The apparatus according to claim 6, wherein the plurality of BIST circuits execute the inspections of the plurality of memories before image sensing by the image sensing apparatus.

8. The apparatus according to claim 6, wherein the plurality of BIST circuits execute the inspections of the plurality of memories in a blanking period between frames during image sensing by the image sensing apparatus.

9. An image sensing apparatus comprising:
a pixel array;
a circuit configured to control the image sensing apparatus or process a plurality of signals output from the pixel array; and
the inspection apparatus according to claim 1,
wherein the plurality of BIST circuits of the inspection apparatus inspect the circuit.

10. An image sensing apparatus comprising:
a pixel array;
a plurality of memories configured to store a signal from the pixel array; and
the inspection apparatus according to claim 1,
wherein the plurality of BIST circuits of the inspection apparatus inspect the plurality of memories.

11. An electronic equipment comprising:
the image sensing apparatus according to claim 9; and
a processing apparatus configured to process a signal output from the image sensing apparatus.

12. An electronic equipment comprising:
the image sensing apparatus according to claim 10; and
a processing apparatus configured to process a signal output from the image sensing apparatus.

13. A transportation equipment that includes a driving apparatus, the equipment comprising:
a control apparatus on which the image sensing apparatus according to claim 9 is mounted, and which is configured to control the driving apparatus based on information obtained by the image sensing apparatus.

14. A transportation equipment that includes a driving apparatus, the equipment comprising:
a control apparatus on which the image sensing apparatus according to claim 10 is mounted, and which is configured to control the driving apparatus based on information obtained by the image sensing apparatus.

* * * * *